(12) United States Patent
Marakhatanov et al.

(10) Patent No.: US 9,881,772 B2
(45) Date of Patent: *Jan. 30, 2018

(54) MULTI-RADIOFREQUENCY IMPEDANCE CONTROL FOR PLASMA UNIFORMITY TUNING

(75) Inventors: Alexei Marakhatanov, Albany, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 788 days.

This patent is subject to a terminal disclaimer.

(21) Appl. No.: 13/433,004

(22) Filed: Mar. 28, 2012

(65) Prior Publication Data

US 2013/0260567 A1 Oct. 3, 2013

(51) Int. Cl.
- C23C 16/00 (2006.01)
- C23F 1/00 (2006.01)
- H01L 21/306 (2006.01)
- H01J 37/32 (2006.01)

(52) U.S. Cl.
CPC .. *H01J 37/32091* (2013.01); *H01J 37/32165* (2013.01)

(58) Field of Classification Search
USPC ..... 118/715, 722, 723 R, 723 E; 315/111.21; 156/345.43–345.47, 345.24–345.28
See application file for complete search history.

(56) References Cited

U.S. PATENT DOCUMENTS

| | | | |
|---|---|---|---|
| 5,460,684 A * | 10/1995 | Saeki et al. | 156/345.51 |
| 6,379,576 B2 * | 4/2002 | Luo | G03F 7/427 |
| | | | 118/723 E |
| 7,264,688 B1 * | 9/2007 | Paterson et al. | 156/345.34 |
| 7,837,826 B2 | 11/2010 | Marakhtanov et al. | 156/345.48 |
| 8,222,157 B2 | 7/2012 | Marakhtanov et al. | 438/718 |
| 8,652,298 B2 * | 2/2014 | Dhindsa et al. | 156/345.45 |

(Continued)

FOREIGN PATENT DOCUMENTS

| CN | 1961402 A | 5/2007 |
|---|---|---|
| CN | 1973364 A | 5/2007 |

(Continued)

*Primary Examiner* — Rakesh Dhingra
(74) *Attorney, Agent, or Firm* — Martine Penilla Group, LLP

(57) ABSTRACT

Circuits, methods, chambers, systems, and computer programs are presented for processing wafers. A wafer processing apparatus includes top and bottom electrodes inside a processing chamber; a first, second, third, and fourth radio frequency (RF) power sources; and one or more resonant circuits. The first, second, and third RF power sources are coupled to the bottom electrode. The top electrode may be coupled to the fourth RF power source, to electrical ground, or to the one or more resonant circuits. Each of the one or more resonant circuits, which are coupled between the top electrode and electrical ground, include a tune-in element operable to vary a frequency-dependent impedance presented by the resonant circuit. The wafer processing apparatus is configurable to select the RF power sources for wafer processing operations, as well as the connections to the top electrode in order to provide plasma and etching uniformity for the wafer.

15 Claims, 12 Drawing Sheets

(56) References Cited

U.S. PATENT DOCUMENTS

| | | | |
|---|---|---|---|
| 2003/0037881 A1* | 2/2003 | Barnes | H01J 37/3244 216/67 |
| 2004/0035365 A1* | 2/2004 | Yamazawa et al. | 118/723 E |
| 2005/0264218 A1 | 12/2005 | Dhindsa et al. | |
| 2007/0012659 A1 | 1/2007 | Rusu et al. | |
| 2007/0227449 A1 | 10/2007 | Yamazawa | 118/723 I |
| 2008/0236750 A1* | 10/2008 | Koshimizu | 156/345.38 |
| 2009/0230089 A1* | 9/2009 | Bera et al. | 216/67 |
| 2010/0252199 A1* | 10/2010 | Marakhtanov | H01J 37/32091 156/345.48 |
| 2010/0294433 A1* | 11/2010 | Jianhui | 156/345.48 |
| 2011/0059615 A1* | 3/2011 | Marakhtanov et al. | 438/710 |

FOREIGN PATENT DOCUMENTS

| | | | |
|---|---|---|---|
| JP | 2001-144077 | 5/2001 | H01L 21/203 |
| JP | 2004-96066 | 3/2004 | H01L 21/3065 |
| JP | 2007-273915 | 10/2007 | H01L 21/3065 |
| JP | 2010-238730 | 10/2010 | H01L 21/203 |
| WO | WO2008010943 A2 | 1/2008 | C23F 1/00 |
| WO | WO2009114262 A2 | 9/2009 | H05H 1/36 |

* cited by examiner $$Z_1 = -j\frac{1}{\omega C_s}$$

$$Z_2 = jL\omega - j\frac{1}{\omega C_x}$$

$$Z_3 = \frac{Z_1 Z_2}{Z_1 + Z_2} = \frac{-j\frac{1}{\omega C_s}\left(jL\omega - j\frac{1}{\omega C_x}\right)}{-j\frac{1}{\omega C_s} + j\left(L\omega - \frac{1}{\omega C_x}\right)} = \frac{j\frac{1}{\omega C_s}\left(L\omega - \frac{1}{\omega C_x}\right)}{\frac{1}{\omega C_s} - \left(L\omega - \frac{1}{\omega C_x}\right)}$$

Resonance when denominator = 0 ($Z_3 \to \infty$)

27MHz resonance circuit

MULTI-RADIOFREQUENCY IMPEDANCE CONTROL FOR PLASMA UNIFORMITY TUNING

CROSS REFERENCE TO RELATED APPLICATIONS

This application is related by subject matter to U.S. patent application Ser. No. 13/301,725, filed Nov. 21, 2011, issued as Pat. No. 8,652,298 on Feb. 18, 2014, and entitled "TRIODE REACTOR DESIGN WITH MULTIPLE RADIOFREQUENCY POWERS", which is incorporated herein by reference.

BACKGROUND

1. Field of the Invention

The present embodiments relate to wafer processing apparatus, and more particularly, apparatus, methods, and computer programs for processing a wafer in a wafer processing apparatus.

2. Description of the Related Art

The manufacturing of integrated circuits includes immersing silicon substrates (wafers) containing regions of doped silicon into chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors.

Current plasma processing systems used in semiconductor wafer fabrication rely on highly interdependent control parameters to control radical separation, radical flux, ion energy, and ion flux delivered to the wafer. For example, current plasma processing systems attempt to achieve necessary radical separation, radical flux, ion energy, and ion flux by controlling a single plasma generated in the presence of the wafer. Unfortunately, chemistry dissociation and radical formation are coupled to ion production and plasma density and often do not work in concert to achieve the desired plasma processing conditions.

Some semiconductor processing equipment may be used in a wide range of applications. However the requirements for each of the applications may vary substantially, and it may be difficult to accommodate all the applications in the same processing equipment without adequate controls to configure the wafer processing process (e.g., to control the plasma chemistry in the chamber). A lack of control on the ion energy in the chamber limits the control of the desired process chemistry. If controls are not adequate, non-uniform deposition may result with non-uniform etching on the wafer.

It is in this context that embodiments arise.

SUMMARY

Embodiments of the disclosure provide circuits, methods, systems, and computer programs for processing wafers. It should be appreciated that the present embodiments can be implemented in numerous ways, such as a process, an apparatus, a system, a device or a method on a computer readable medium. Several embodiments are described below.

In one embodiment, a wafer processing apparatus includes top and bottom electrodes of a processing chamber, a first radio frequency (RF) power source, a second RF power source, a third RF power source, a fourth RF power source, and one or more resonant circuits. The first, second, and third RF power sources are coupled to the bottom electrode. The top electrode may be coupled to the fourth RF power source, to electrical ground, or to the one or more resonant circuits. Each of the one or more resonant circuits resonate at one of the frequencies of the RF power sources coupled to the bottom electrode. In one embodiment, a first resonant is coupled between the top electrode and electrical ground, the first resonant circuit including a tune-in element operable to vary a frequency dependent impedance of the first resonant circuit. The wafer processing apparatus is configurable to select the RF power sources for wafer processing operations, as well as the connections to the top electrode in order to provide plasma and etching uniformity for the wafer.

In another embodiment, a wafer processing apparatus includes top and bottom electrodes of a processing chamber, a first radio frequency (RF) power source, a second RF power source, a third RF power source, a fourth RF power source, a first resonant circuit, a first switch, a second switch, and a third switch. The first, second, and third RF power sources are coupled to the bottom electrode. Further, the first switch is operable to couple the top electrode to the fourth RF power source, the second switch is operable to couple the top electrode to the first resonant circuit, and the third switch is operable to couple the top electrode to a first voltage. In one embodiment, the first voltage is electrical ground.

In yet another embodiment, a method for processing a wafer in a wafer processing apparatus, which includes a top electrode and a bottom electrode of a processing chamber, includes an operation for receiving a recipe for processing the wafer and an operation for enabling or disabling each of a first radio frequency (RF) power, a second RF power, a third RF power, and a fourth RF power based on the recipe. The first, second, and third RF powers are coupled to the bottom electrode. In addition, a position of a first switch is set based on the recipe to couple or decouple the top electrode to the fourth RF power, and a position of a second switch is set based on the recipe to couple or decouple the top electrode to a first resonant circuit. The method further includes an operation for setting a position of a third switch based on the recipe to couple or decouple the top electrode to electrical ground, and an operation for processing the wafer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe apparatus, methods and computer programs for processing a wafer in a wafer processing apparatus. Embodiments of the disclosure use up to four different RF powers in a triode reactor configuration and one or more resonant circuits coupled to the top electrode. It will be apparent, that the present embodiments may be practiced without some or all of these specific details. In other instances, well known process operations have not been described in detail in order not to unnecessarily obscure the present embodiments.

Figure 1:
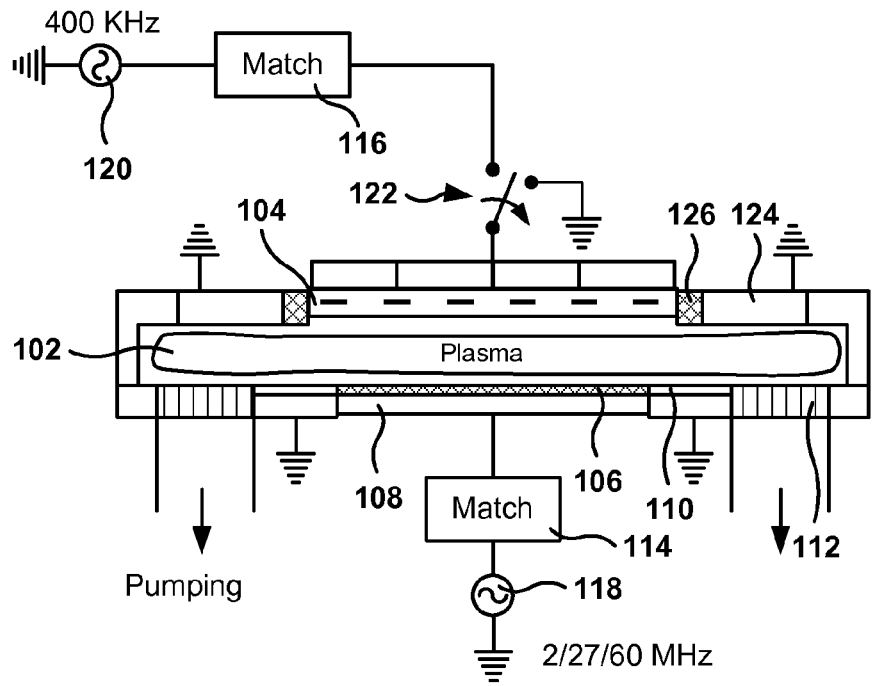
FIG. 1 shows an etching chamber, according to one embodiment.

FIG. 1 shows an etching chamber, according to one embodiment. Exciting an electric field between two electrodes is one of the methods to obtain RF gas discharge in an etching chamber. When an oscillating voltage is applied between the electrodes, the discharge obtained is referred to as a Capacitive Coupled Plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer. This is known as ion bombardment or ion sputtering. Some industrial plasmas, however, do not produce ions with enough energy to efficiently etch a surface by purely physical means.

In one embodiment, Fluorocarbon gases, such as $CF_4$ and $C$—$C_4F_8$, are used in the dielectric etch process for their anisotropic and selective etching capabilities, but the principles described herein can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

The chamber of FIG. 1 illustrates a processing chamber with a top electrode 104 and a bottom electrode 108. Top electrode 104 may be grounded or coupled to RF generator 120, and the bottom electrode 108 is coupled to RF generator 118 via matching network 114. RF generator 118 provides RF power in 1, 2, or 3 RF frequencies. According to the configuration of the chamber for a particular operation, either one of the first, second, or third RF frequencies may be turned on or off. In the embodiment shown in FIG. 1, RF generator 118 provides 2 MHz, 27 MHz, and 60 MHz frequencies, but other frequencies are also possible.

The chamber of FIG. 1 includes a gas showerhead on the top electrode 104 to input gas in the chamber, and a perforated confinement ring 112 that allows the gas to be pumped out of the chamber. When substrate 106 is present in the chamber, silicon focus ring 110 is situated next to the substrate such that there is a uniform RF field at the bottom surface of the plasma 102 for uniform etching on the surface of the wafer.

Upper electrode 104 may be coupled to ground or coupled to RF power source 120. Switch 122 is operable to connect the top electrode 104 to ground when the switch is in a first position, or to RF power source 120 when the switch is in a second position. Matching network 116 is used to couple top RF power source 120 to the top electrode when the switch 122 is in the second position.

The embodiment of FIG. 1 shows a triode reactor configuration where the top electrode is surrounded by a symmetric RF ground electrode 124. Insulator 126 is a dielectric that isolates ground electrode 124 from top electrode 104. In one embodiment, RF power source 120 has a frequency of 400 kHz, but other frequencies are also possible. The low frequency RF power on the top electrode controls the ion energy on the top chamber as well as on the reactor walls. This provides another control of the plasma chemistry in the chamber, enabling operation-by-operation adjustment of the power setting in the recipes for wafer processing.

Each frequency may be selected for a specific purpose in the wafer manufacturing process. In the example of FIG. 1, with RF powers of 2 MHz, 27 MHz, and 60 MHz, the 2 MHz RF power provides ion energy control, and the 27 MHz and 60 MHz power provide control of the plasma density and the dissociation patterns of the chemistry. This configuration, where each RF power may be turned on or off, enables certain processes that use ultra-low ion energy on the wafers, and certain processes (e.g., soft etch for low-k materials) where the ion energy has to be low (under 100 or 200 eV).

In another embodiment, a 60 MHz RF power is used on the top electrode to get ultra-low energies and very high density. This configuration allows chamber cleaning with high density plasma when the wafer is not in the chamber, while minimizing sputtering on the ESC (electro static chuck) surface. The ESC surface is exposed when the wafer is not present, and any ion energy on the surface must be avoided, which is why the bottom 2 MHz and 27 MHz power supplies are off during cleaning.

The chamber with four RF powers provides hardware controls for the plasma chemistries, as well as for the plasma density and uniformity. For example, the radial uniformity may be controlled with the independent RF source at the top.

FIGS. 2A-2E show several embodiments of an etching chamber with one or more resonant circuits. Embodiments provide controls for the uniformity of the plasma and the etching rate in the chamber that includes the addition of one or more resonant circuits coupled to the top electrode. By controlling the RF impedance of on the upper electrode, it is possible to provide radial uniformity control for the RF frequencies generated at the bottom electrode (e.g., 2 MHz, 27 MHz, and 60 MHz).

Resonance is the tendency of a system to oscillate at a greater amplitude at some frequencies than at others. These are known as the system's resonant frequencies (or resonance frequencies). At these frequencies, even small periodic driving forces can produce large amplitude oscillations, because the system stores vibrational energy. A resonant circuit, as used herein, is an electronic circuit that includes one or more inductors and one or more capacitors, presents an impedance that varies with the applied radiofrequency, and also presents infinite impedance at the resonance frequency of the circuit.

In an ideal resonant circuit, there is no dissipation of energy due to resistance, but in reality small resistance elements in inductors and capacitors results in small losses of energy. This means that the impedance at the resonant frequency will not be infinite, but the impedance will have a very large value. Therefore, the impedance at the resonant frequency will be the highest value (i.e., the maximum) of the impedance of the circuit for any frequency. If the elements in the resonant circuit were perfect, then the impedance would be infinite.

Sometimes, the etching of the wafer is not uniform across the complete surface of the wafer, due to variations of the plasma density throughout the chamber. One way to control the uniformity is to change the gap. However, if the gap is shortened, the plasma is compressed and there may be a W pattern in the etch ratio based on the distance from the center of the wafer. Further, some recipes are not sensitive to a change in the gap, and changing the gap would not provide a control for the etch uniformity for these recipes.

Another way to control uniformity is to change the outer electrode 124 step, which may affect the etching on the edge of the wafer. However, changing the step is a costly operation in terms of throughput, as the step may need to be adjusted several times for different operations of the process.

Figure 2A:
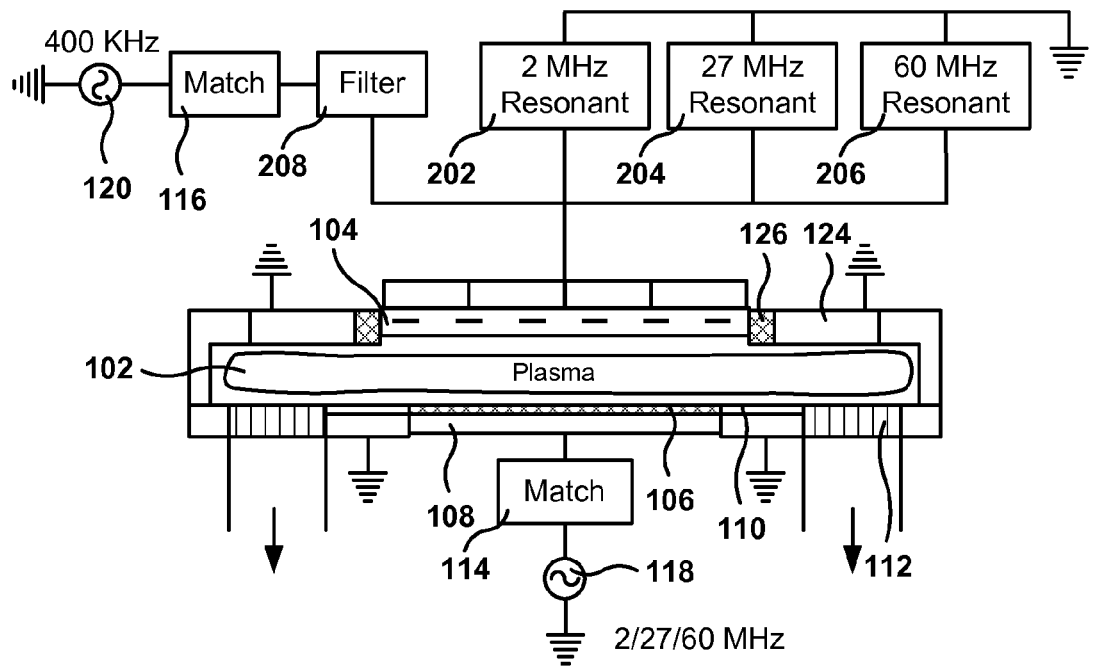
FIGS. 2A-2E show several embodiments of an etching chamber with one or more resonant circuits.

FIG. 2A is an embodiment of an etching chamber with three RF powers 118 applied to the bottom electrode, and three corresponding resonant circuits 202, 204, and 206 connected to the top electrode. Each resonant circuit resonates at one of the frequencies of the RF powers applied to the bottom electrode 108. Since each resonant circuit presents a high impedance (infinite impedance for a perfect resonant circuit), the RF power applied to the bottom electrode may be "searching" for another path to ground, which means that the RF power of the top electrode may be affected. In one embodiment, a filter 208 is placed between the top electrode and the match circuit 116, associated with the RF power source 120 coupled to the top electrode 104, to block the RF powers from the bottom electrode to reach the RF power source of the top electrode.

Each resonant circuit (202, 204, or 206) has a frequency-dependent impedance, where the maximum value of the impedance corresponds to the resonant frequency, e.g., the frequency of one of the RF powers on the bottom electrode. For example, resonant circuit 202 presents a frequency-dependent impedance, wherein a maximum value of the frequency-dependent impedance of resonant circuit 202 corresponds to the frequency of an RF power of the bottom electrode (e.g., 2 Megahertz). If resonant circuit 202 were built with ideal components (e.g., lacking a resistive component), resonant circuit 202 would present an infinite impedance at the resonating frequency (e.g., 2 Megahertz). More details are provided below with reference to FIGS. 3A and 3B regarding the calculation of the impedance of a resonant circuit.

Each resonant circuit is designed to resonate at one of the frequencies applied to the bottom electrode. The resonant circuits affect the sheath of the upper electrode, the voltage of the sheath, and the phase of the sheath. The resonant circuits also affect the RF current in the plasma.

The semiconductor processing system may be configure at each semiconductor processing operation, where different powers may be applied to the top and bottom electrodes, and different resonant circuits may be coupled to the top electrode. This provides flexibility in the processing of the wafer, which may have different requirements (e.g., power levels, etching rates, voltage levels, etc.) for each wafer processing operation.

FIGS. 2A-2E illustrate some of the possible configurations of the semiconductor chamber. It is noted that the embodiments illustrated in FIGS. 2A-2E are exemplary and do not represent an exhaustive list of all possible configurations of the chamber. Each RF power source, top and bottom, and each resonant circuit may be utilized during a particular operation. In addition, the top electrode may also be coupled to electrical ground in some embodiments. Further yet, the RF powers applied to the top and bottom electrode may operate at other frequencies than the ones illustrated herein. The embodiments illustrated in FIGS. 2A-2E should therefore not be interpreted to be exclusive or limiting, but rather exemplary or illustrative.

Figure 2B:
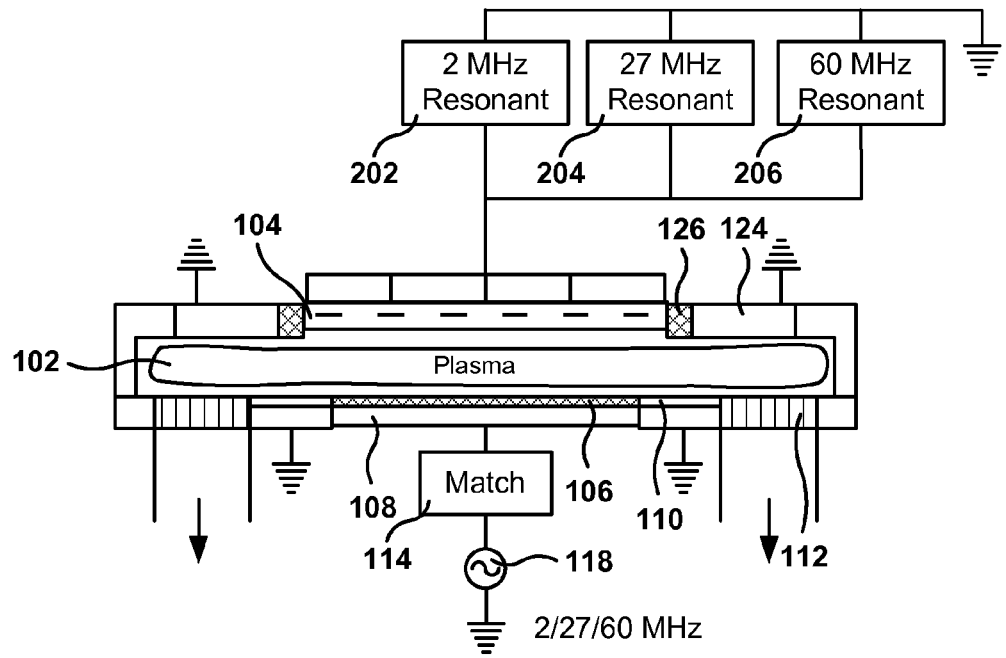

For example, FIG. 2B illustrates a chamber with three RF powers applied to the bottom electrode and no RF power on the top electrode. In addition, the chamber includes three resonant circuits 202, 204, and 206, arranged in parallel between the top electrode 104 and electrical ground.

When RF power is applied to the top electrode (e.g., the chamber of FIG. 2A), there is more RF power applied to the plasma than in the case of the chamber of FIG. 2B, which does not have RF power on the top electrode. This causes different operating regimes for the chambers of FIGS. 2A and 2B. Depending on the process, the system may utilize RF power on the top electrode or not. In addition, in some embodiments the impedance of the upper electrode is adjusted by utilizing the resonant circuits, which enables further control of the sheath at the upper electrode.

Figure 2C:
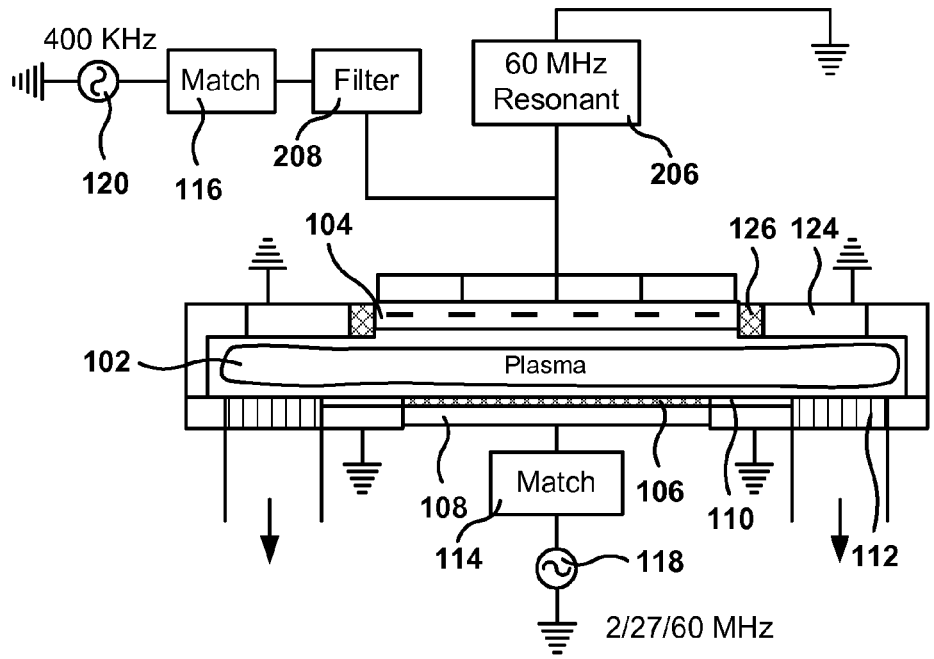

The chamber of FIG. 2C includes three RF powers on the bottom electrode and one RF power on the top electrode, and there is one resonant circuit 206 at 60 Megahertz coupled to the top electrode. This configuration allows the RF power for the 2 Megahertz and the 27 Megahertz to have a path to ground on the top electrode, but the 60 Megahertz RF power will have to follow a different path to electrical ground that does not go through the top electrode. In other words, the chamber of FIG. 2C provides impedance control of the plasma for only one of the RF powers applied to the bottom electrode.

Figure 2D:
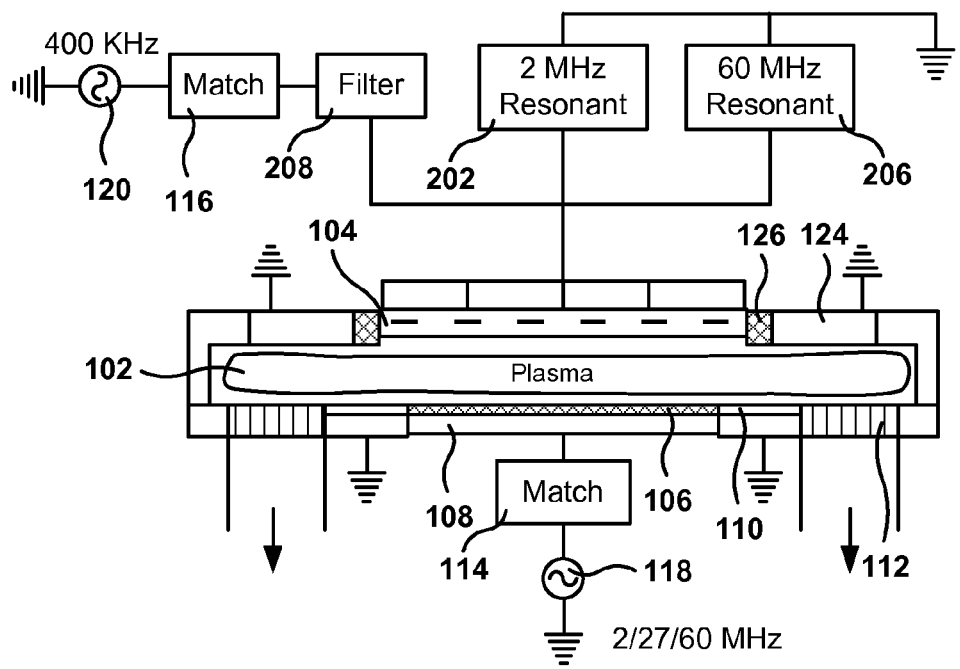
Figure 2E:
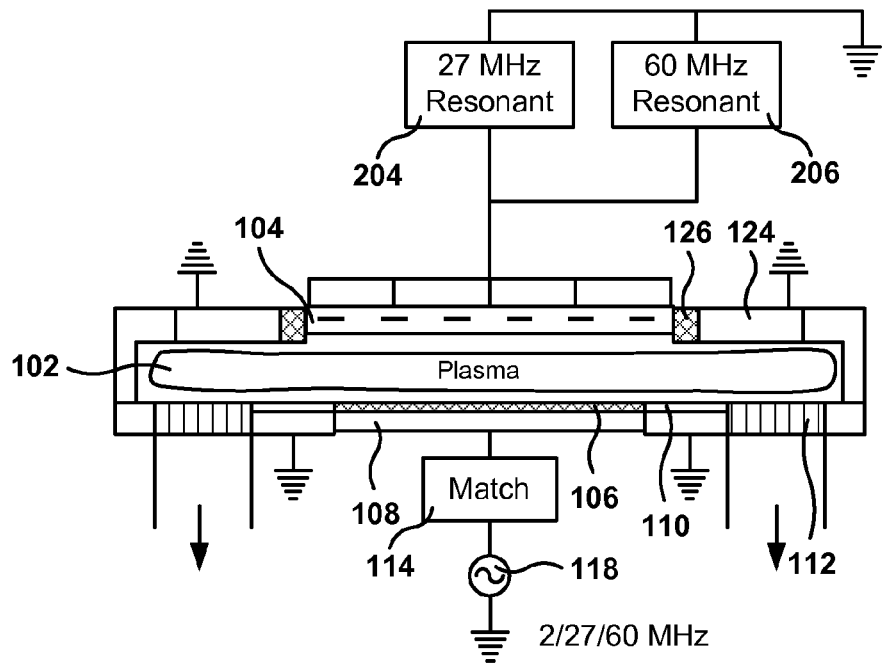

FIG. 2D illustrates an embodiment of a chamber with four RF power sources (one on the top and three on the bottom), and two resonant circuits 202 and 206 coupled to the top electrode. In this chamber, there is no resonant circuit for the 27 Megahertz RF power. FIG. 2E is a semiconductor processing chamber with no RF power on the top electrode and resonant circuits for the 27 Megahertz and 60 Megahertz frequencies. The two resonant circuits 204 and 206 are connected in parallel between the top electrode 104 and electrical ground. In this embodiment, no RF power is applied to the top electrode 104.

Figures 3A, 3B:
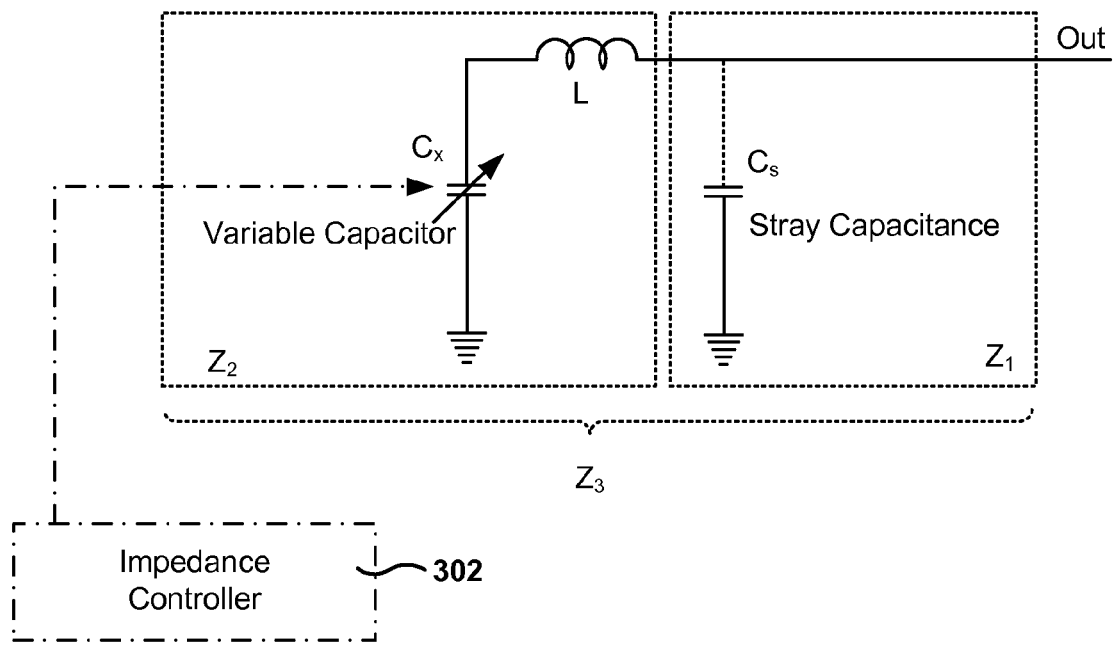
FIG. 3A illustrates a resonant circuit, according to one embodiment.
FIG. 3B illustrates the formula for calculating the impedance of a resonant circuit, according to one embodiment.

FIG. 3A illustrates a resonant circuit, according to one embodiment. FIG. 3A illustrates a resonant circuit for the 60 Megahertz RF power, and the resonant circuits for other frequencies may be built with a similar arrangement of components but with different values for the inductors and capacitors in the resonant circuit. In addition, it is noted that the embodiment illustrated in FIG. 3A is exemplary. Other embodiments may utilize different arrangement of circuit elements, and different values for the circuit elements, as long as the circuit resonates at the desired frequency (e.g., the circuit presents infinite impedance at the desired frequency if perfect components where utilized). The embodiment illustrated in FIG. 3A should therefore not be interpreted to be exclusive or limiting, but rather exemplary or illustrative. In one embodiment, a circuit having two or more resonance frequencies is utilized instead of having separate resonant circuits.

Because the top and bottom electrodes are isolated from ground in some embodiments (see for example FIGS. 2A-2E) via insulators, there is a capacitance between ground and the top electrode, which is referred to herein as stray capacitance $C_s$. The resonant circuit also includes an inductance L and a variable capacitance $C_x$.

The capacitance value of variable capacitor $C_x$ is adjusted in order to obtain the desired resonant frequency for the resonant circuit. Details on the calculation of the value for $C_x$ are given below with reference to FIG. 3B. The impedance of the chamber is calculated for the different values of $C_x$, and the value of $C_x$ that makes the circuit resonates at the desired frequency is utilized. In other words, the value of the capacitance of $C_x$ is adjusted until the desired resonance frequency is achieved. See more details below for fine-tuning the resonant circuit with reference to FIG. 8B.

In addition, as the value of $C_x$ changes, the values of the voltages in the upper and lower electrodes also change. In one embodiment, the inductance L has a value between 0.1 uH and 1 uH, but other values are also possible. In another embodiment, the value of $C_x$ is in the range of 3 to 34 pF, but other values are also possible. In one experiment, the stray capacitance $C_s$ was measured having a value of 577 pF.

FIG. 3B illustrates the formula 316 for calculating the impedance of a resonant circuit, according to one embodiment. $Z_1$ is the impedance value for the stray capacitance $C_s$ and $Z_1$ is calculated according to the following formula:

$$Z_1 = -j\frac{1}{wC_s} \quad (1)$$

$Z_2$ is the impedance of the serial combination of the inductance L and variable capacitor $C_x$. Since the capacitor and the inductance are connected serially, the impedance $Z_2$ of the combination may be calculated according to the following formula:

$$Z_2 = jLw - j\frac{1}{wC_x} \quad (2)$$

$Z_3$ is the impedance of the resonant circuit and is calculated by applying the calculation of two impedances in parallel, $Z_1$ and $Z_2$, according to the following formula:

$$Z_3 = \frac{Z_1 Z_2}{Z_1 + Z_2} \quad (3)$$

Combining equations (1), (2) and (3), the value of $Z_3$ may be calculated as follows:

$$Z_3 = \frac{j\frac{1}{wC_s}\left(Lw - \frac{1}{wC_x}\right)}{\frac{1}{wC_s} - \left(Lw - \frac{1}{wC_x}\right)} \quad (4)$$

When the denominator of equation is equal to 0, then $Z_3$ has a value of infinity (or a very high impedance value when components are not ideal due to some resistive element in capacitors and inductance). It is noted that, for the same resonating frequency, higher inductance values of L translates into lower $C_x$ values. In other words, there is a tradeoff between the values utilized for the inductance L and the value required for capacitor $C_x$.

Figure 4A:
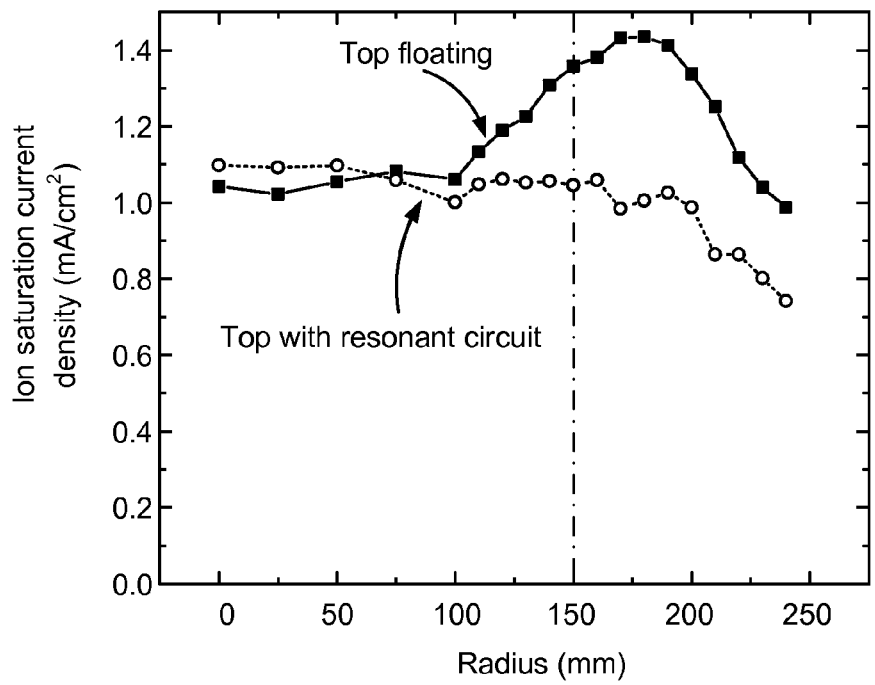
FIGS. 4A-4C present charts related to the performance of a processing apparatus with a 60 MHz resonant circuit, according to one embodiment.
Figure 4B:
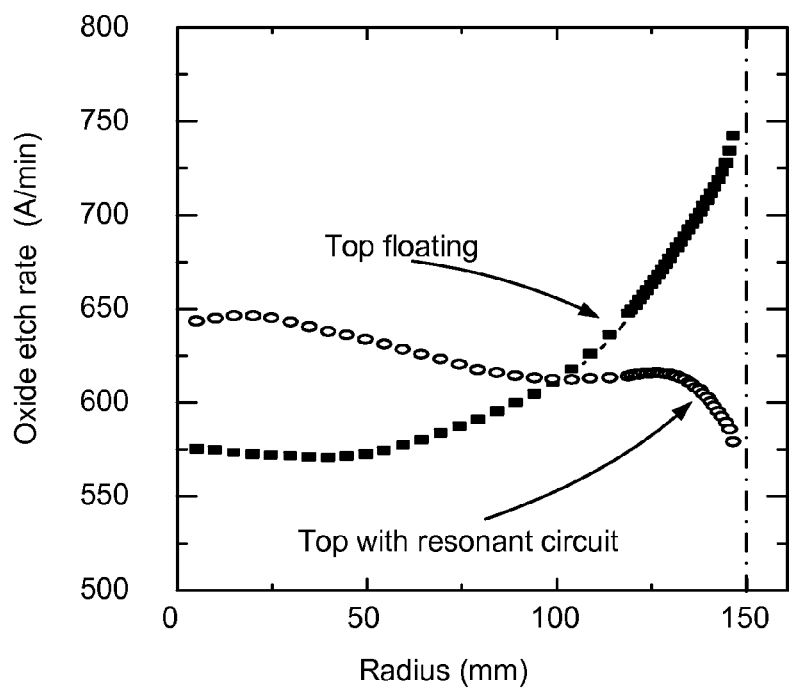
Figure 4C:
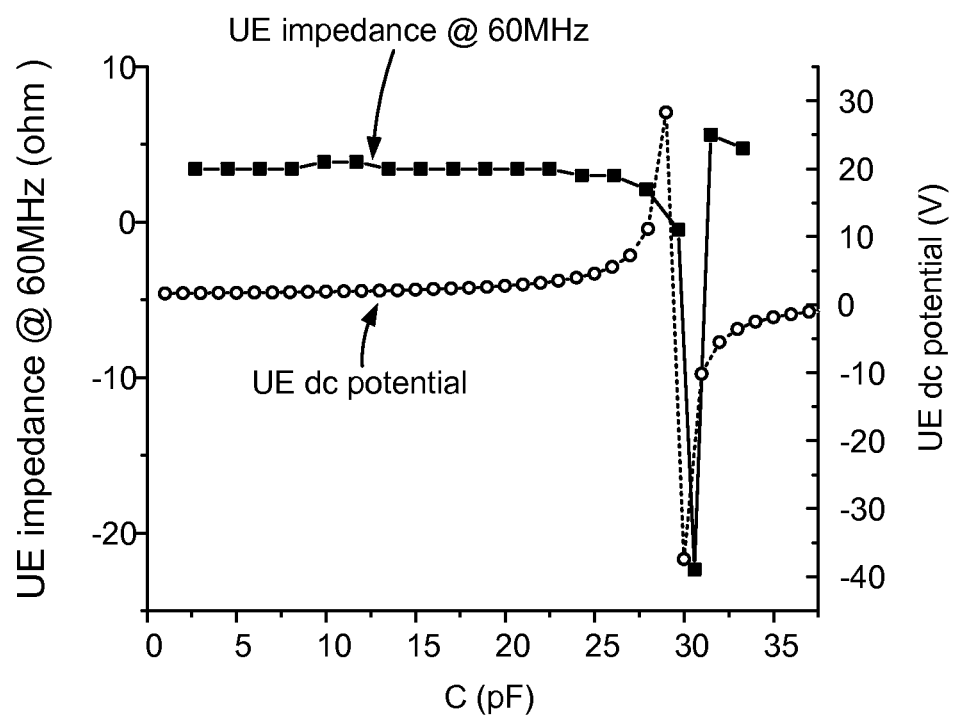

FIGS. 4A-4C present charts related to the performance of a processing apparatus with a 60 MHz on the bottom electrode and a 60 MHz resonant circuit on the top electrode, according to one embodiment. FIG. 4A is a chart showing the ion saturation current density (mA/cm$^2$) as a function of the distance from the center of the substrate (radius). In one embodiment, the substrate is 300 mm in diameter, but the same principles apply to wafers of any size. FIG. 4A includes two lines: a first line when the top electrode is electrically floating, and a second line when the top electrode includes a 60 Megahertz resonant circuit. When the top electrode is floating, the ion density increases from about 100 mm to 180 mm. However, when the top electrode has the 60 MHz resonant circuit, the ion density stays substantially constant from 0 to beyond 150 mm. The ion density decreases outside the 150 mm, which does not affect the etching on the wafer, since the wafer has a radius of 150 mm. Therefore, there is uniformity on the surface of the wafer when using the resonant circuit.

FIG. 4B shows the etch rate when using a 60 MHz resonant circuit on the top electrode or when using a top electrode that is electrically floating. When the top electrode is floating, the etch rate grows rapidly when going beyond a radius of about 75 millimeters, meaning that the etch rate is not uniform across the surface of the substrate. However, when a 60 Megahertz resonant circuit is coupled to the top electrode, the etch rate shows a substantially uniform etching rate across the whole surface of the substrate.

It is noted that the measurements shown for FIGS. 4A and 4B are examples for a certain configuration of the etching chamber under pre-determined conditions. The measurements were taken to assess the differences between a chamber with a resonant circuit and without. However, actual density and etching rates on the chamber may vary from the charts shown in FIGS. 4A and 4B due to other factors involved when utilizing different recipes for the process. The embodiments illustrated in FIGS. 4A-4B should therefore not be interpreted to be exclusive or limiting, but rather exemplary or illustrative.

FIG. 4C shows the impedance of the upper electrode when using a 60 Megahertz resonant circuit on the upper electrode. The chart shows the upper electrode impedance when using a 60 megahertz power source at the bottom electrode, and the DC potential of the upper electrode, as a function of the capacitance value of the adjustable capacitor $C_X$.

In one embodiment, when the capacitor has a value of about 30 pF the impedance becomes very large. The DC potential of the upper electrode also falls to about −40 volts. The minimum of the upper electrode impedance indicates the resonance point at 60 Megahertz. It is also noted, that in one embodiment, the phase of the RF signal also changes at the resonance point.

When there is resonance, the impedance approaches infinite, which stops the RF from going to the upper electrode, and the RF signal has to find a different path to ground. Is noted that it is difficult to operate at the resonant point because of the fast slope in the impedance line right before and after the resonant point.

To operate in the resonant point, the capacitance $C_x$ is changed until the minimum for the voltage is found. But due to the sharp slope of the impedance curve, there may be problems with stability. In one embodiment, the Q of the curve is lowered (related to the slope at the resonance point) to make the circuit stable at the resonance point. This is accomplished by adding some resistive components in the circuit, which helps lowering the Q.

Figure 5A:
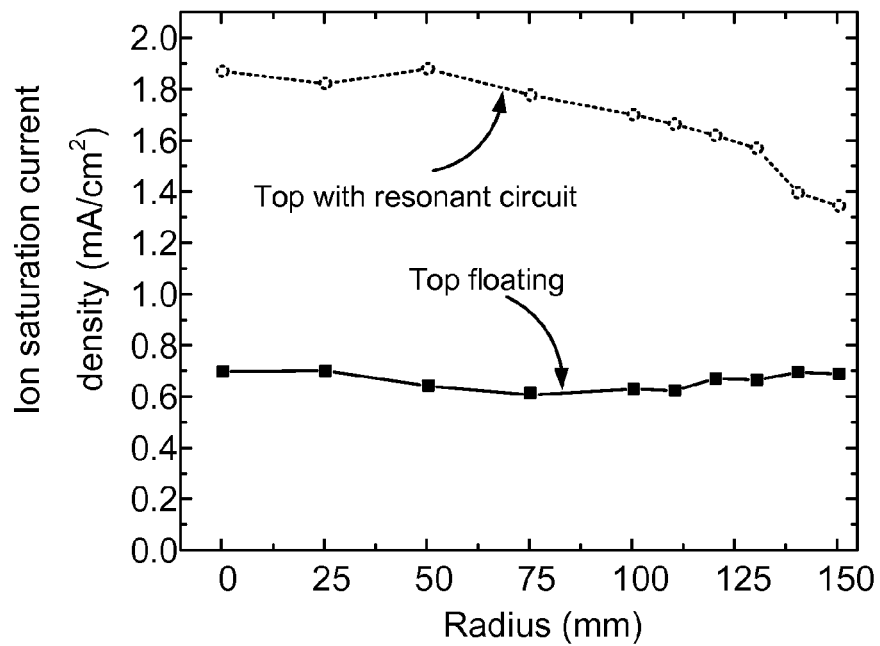
FIGS. 5A-5B present charts related to the performance of a processing apparatus with a 2 MHz resonant circuit, according to one embodiment.
Figure 5B:
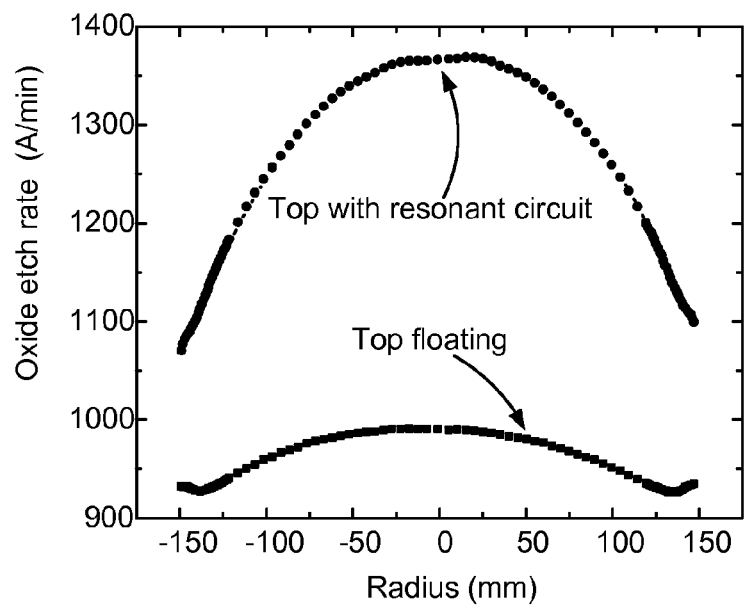

FIGS. 5A-5B present charts related to the performance of a processing apparatus with a 2 MHz power on the bottom electrode and a 2 MHz resonant circuit, according to one embodiment. FIGS. 5A and 5B show the results of a chamber utilizing one single RF power of 2 Megahertz. FIG. 5A shows the plasma density as a function of the distance from the center of the substrate when using a 2 Megahertz RF power at the bottom electrode. When the top electrode is floating (e.g., not coupled to power or electrical ground) the density across the surface of the substrate is uniform.

When using a 2 Megahertz resonance circuit on the top electrode the density is higher at the center, decreasing almost linearly from 50 to 150 mm. Normally upper and lower electrode plasma sheaths run out of phase. At 2 Megahertz, there are high voltages on the sheath and when the resonant circuit is utilized there is a change in the phase of the two sheaths, which may cause some physical effects. This leads to electron trapping plasma and density enhancement, because the plasma density is higher when utilizing the resonance circuit. When there is resonance, there is a high etch rate on the center because the two sheets are in-phase, or almost in-phase. This means that the 2 Megahertz resonant circuit may not be useful to provide process uniformity over the surface of the wafer for some processes, but for other processes it may compensate center slow etch rate.

FIG. 5B shows that the etch rate is higher at the center of the wafer when the top electrode is floating, gradually decreasing towards the edge of the wafer. However, when the resonant circuit is coupled to the top electrode, the effect is substantially increased, and the etch rate at the edge of the wafer is much less than the etch rate at the center of the wafer.

There are more secondary electrons produced at the bottom due to the increased density when using the resonant circuit, as there are more electrons reflected from the top sheath back into the plasma. This causes an increase in plasma density due to the additional ionization. In addition, there are more secondary electrons produced at the top electrode due to the higher sheath potential and the more negative upper electrode voltages, resulting in additional ionization and an increase in the plasma density.

Figure 6A:
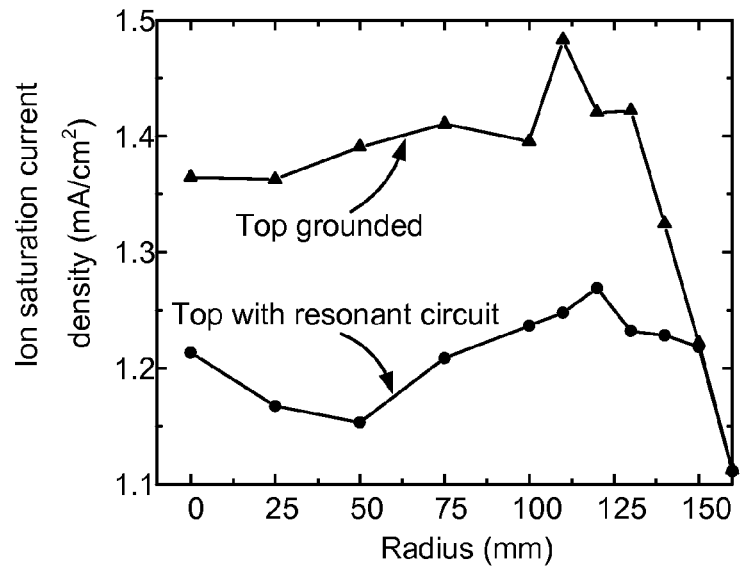
FIGS. 6A-6B present charts related to the performance of a processing apparatus with a 27 MHz resonant circuit, according to one embodiment.
Figure 6B:
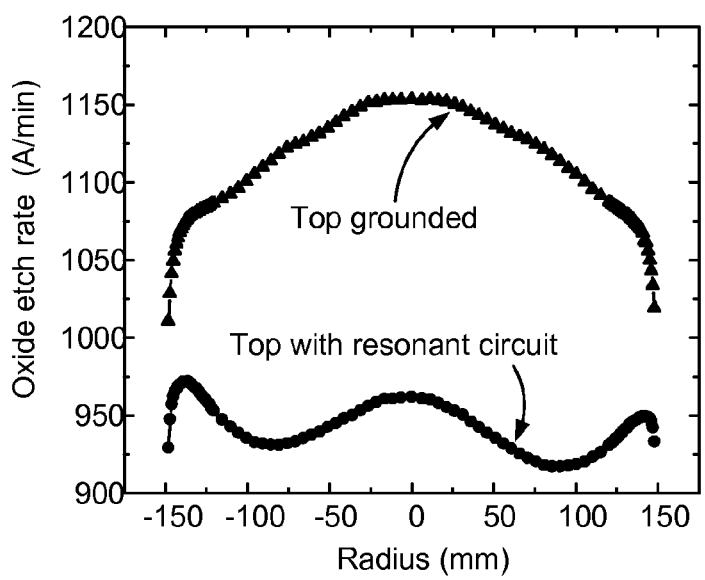

FIGS. 6A-6B present charts related to the performance of a processing apparatus with a 27 MHz resonant circuit, according to one embodiment. FIGS. 6A and 6B show the results of the performance measurements in the chamber when utilizing a single RF power of 27 megahertz at the bottom electrode. As observed in FIG. 6A, the plasma density is higher when the top electrode is grounded than when the top electrode includes the resonant circuit.

When the top electrode is grounded, the density is substantially uniform until about 130 mm, the density decreasing rapidly after 130 mm. When utilizing the resonant circuit, the density offers some variation but there is not such a sharp decrease at the edge of the wafer as in the case of the grounded top electrode.

FIG. 6B illustrates the variation in the etch rate across the surface of the substrate. When the top electrode is grounded there is a sharp difference between etch rates at the center and the edge of the wafer. When using a resonant circuit on the top, the etch rate shows a W shape, which presents more uniformity across the wafer that in the case of the grounded electrode. It is believed that the reason for the W shape is that both fundamental (27 Megahertz) and its harmonics have an effect on the etch uniformity.

By comparing the different effects of the resonant circuits, as described above with reference to FIGS. 4A-6B, it appears that the 60 Megahertz resonance circuit may be utilized to increase the etch uniformity across the wafer. The 27 Megahertz and 60 Megahertz do not present such a strong effect on the etch rate, because there is not such an impact on the trapping of the electrodes in the sheath, as the sheath voltage is smaller.

Figure 7:
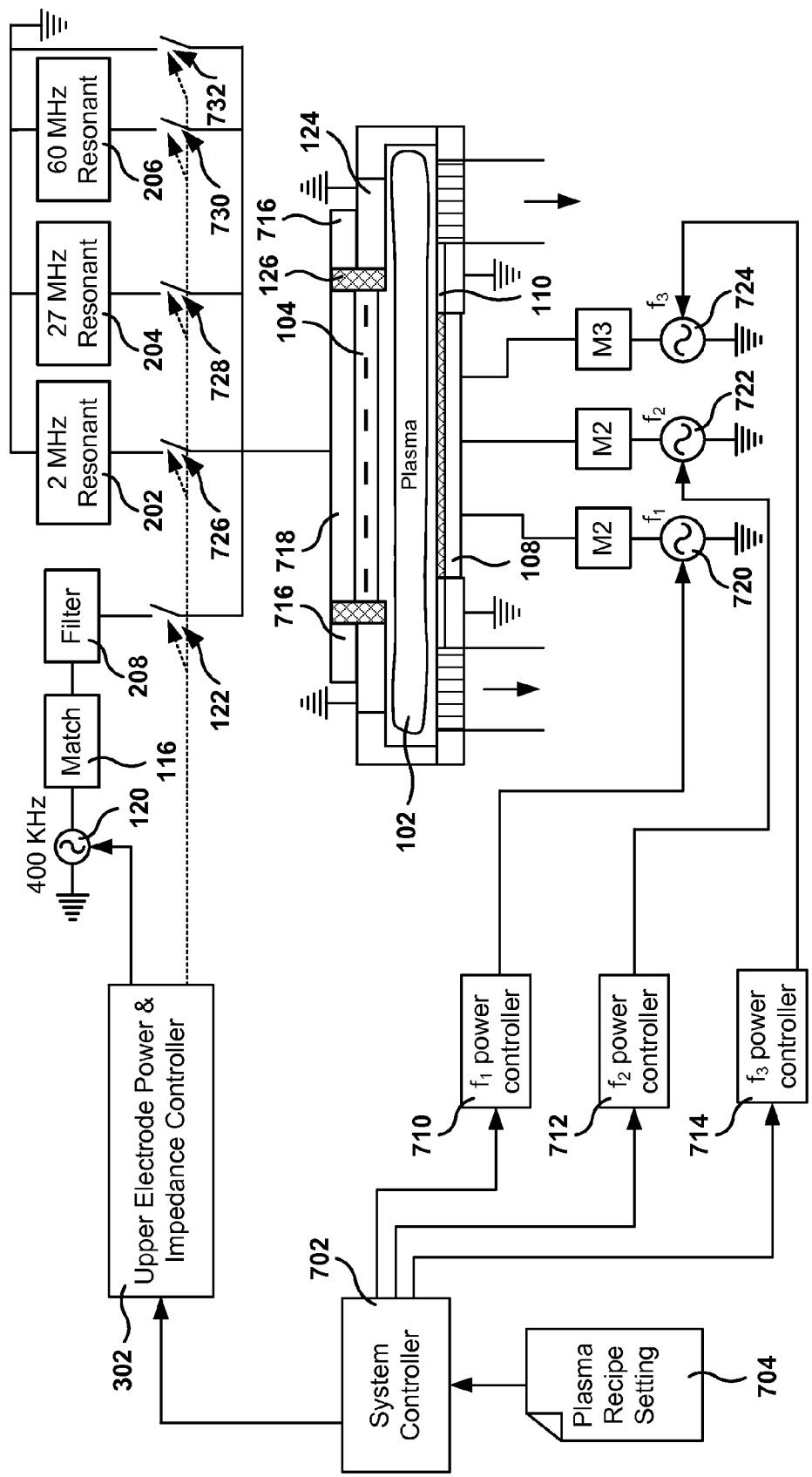
FIG. 7 shows a semiconductor wafer processing apparatus, in accordance with one embodiment.

FIG. 7 shows a semiconductor wafer processing apparatus, in accordance with one embodiment. The chamber of FIG. 7 includes RF power sources 720, 722, and 724 with RF frequencies $f_1$, $f_2$, $f_3$, respectively, which are connected to the bottom electrode 108 via the corresponding matching networks M1, M2, and M3, respectively. The top electrode 104 is connected to a fourth RF power source 120, having an RF frequency $f_4$, via switch 122 and matching network 116. Switch 122 couples or decouples the fourth RF power source to the top electrode 104. In one embodiment, filter 208 is utilized to filter out other RF frequencies from reaching the fourth RF power source 120.

Further, the chamber includes several switches to configure the connections to the top electrode 104. Switch 726 is operable to connect or disconnect the 2 Megahertz resonant circuit 202 to the top electrode. Switch 728 is operable to connect or disconnect the 27 Megahertz resonant circuit 204 to the top electrode. Further, switch 730 is operable to connect or disconnect the 60 Megahertz resonant circuit 206 to the top electrode. In addition, the top electrode may the grounded via switch 732, which connects or disconnects the top electrode to electrical ground.

A first heater 718 is situated above the top electrode 104, and a second heater 716 is situated above ground electrode 124. The heaters are isolated from the top electrode and the ground electrode by a layer of aluminum nitride material, although other insulators may also be utilized. Heater 716 controls the temperature in the outer area of the ground electrode, and heater 718 controls the temperature of the upper electrode. Each heater is operable to be turned on or turned off independently during a wafer processing operation.

Controlling the temperature of the upper electrode may be utilized to adjust the response of the chamber. However, controlling the temperature has the limitation that the temperature cannot be changed quickly. Therefore, temperature control provides a slow response to changes in the chamber. It is difficult to control each wafer-processing operation utilizing temperature control of the top electrode. In addition, there is an upper limit to the temperature that can be applied to the silicon surfaces in the chamber.

The wafer processing apparatus further includes system controller 702, upper electrode power and impedance controller 302, and power controllers 710, 712, and 714 for $f_1$, $f_2$, and $f_3$, respectively. System controller 702 receives a plasma recipe 704, which includes instructions for the different operations performed on the chamber. Processing of the wafer may be done in multiple operations, and each operation may require different settings in the chamber. For example, in one operation all four RF power sources are turned on, while in other operations only 3, or 2, or 1 RF power sources are turned on, etc.

Upper electrode power and impedance controller 302 is operable to set the position of switches 122, 726, 728, 730, and 732 coupled to the top electrode, enabling the top electrode to be configured at different processing operations in the chamber. In addition, the upper electrode power and impedance controller 302 is operable to turn off RF power source 120 when the RF power source is not required for a given operation. The system controller 702 interacts with the upper electrode power and impedance controller 302 to set the appropriate parameters in the chamber based on the received plasma recipe 704.

Based on the plasma recipe 704, the system controller sets the operational parameters of the chamber, including which RF power sources are turned on or turned off, their voltages and their power settings, the setting of switches 122, 726, 728, 730, and 732, the settings for heaters degrees 316 and 318, the gasses used in the chamber, the pressure on the chamber, the duration of the wafer-processing operation, etc. In one embodiment, the system controller 702 sends instructions to upper electrode power and impedance controller 302 for the configuration of the power on the top electrode, which includes setting the position of the switches, and turning on or off RF power 120, and setting the power level for RF power 120 during operation.

System controller 702 also interfaces with power controllers 710, 712, and 714, which regulate whether the corresponding RF powers 720, 722, and 724 are turned on or off, and if a power is turned on, to what power setting. In one embodiment, the frequency of RF power source 120 is 400 kHz. In another embodiment, the frequency is in the range from 400 kHz to 2 MHz, while in yet another embodiment the frequency is in the range from 100 kHz to 10 MHz. In some operations, the three bottom RF powers are not turned on simultaneously, which allows having a higher frequency at the top RF. In one embodiment, the frequency of RF power source 120 is different from the frequencies at the bottom $f_1$-$f_3$ in order to avoid resonance in the chamber.

In one embodiment, the pressure in the chamber has a value between 20 mTorr and 60 mTorr. In another embodiment, the voltage of the top power source can be in the range of hundreds of volts (e.g., 100 V to 2000 V or more), and the bottom RF power sources can have a voltage up to 6000 V or more. In one embodiment, the voltage is 1000 V. In another embodiment, the voltage of the top RF power source has a value between 100 V and 600 V, and the voltage of the bottom RF power sources has a value between 1000 V and 6000V. The pressure in the top chamber and the bottom chamber can have a value between 10 mTorr and 500 mTorr. In one embodiment, the chamber operates at a pressure of 15 mTorr.

It is noted that the embodiment illustrated in FIG. 7 is exemplary. Other embodiments may utilize different types of chambers, different frequencies, other types of adjustments for the chamber configuration based on the recipe, different pressures in the chamber, etc. For example, in one embodiment, the chamber is a CCP plasma chamber. Furthermore, some of the modules described above in the semiconductor wafer processing apparatus may be combined into a single module, or the functionality of a single module may be performed by a plurality of modules. For example, in one embodiment, power controllers 710, 712, and 714 are integrated within system controller 302, although other configurations are also possible. The embodiment illustrated in FIG. 7 should therefore not be interpreted to be exclusive or limiting, but rather exemplary or illustrative.

Figure 8A:
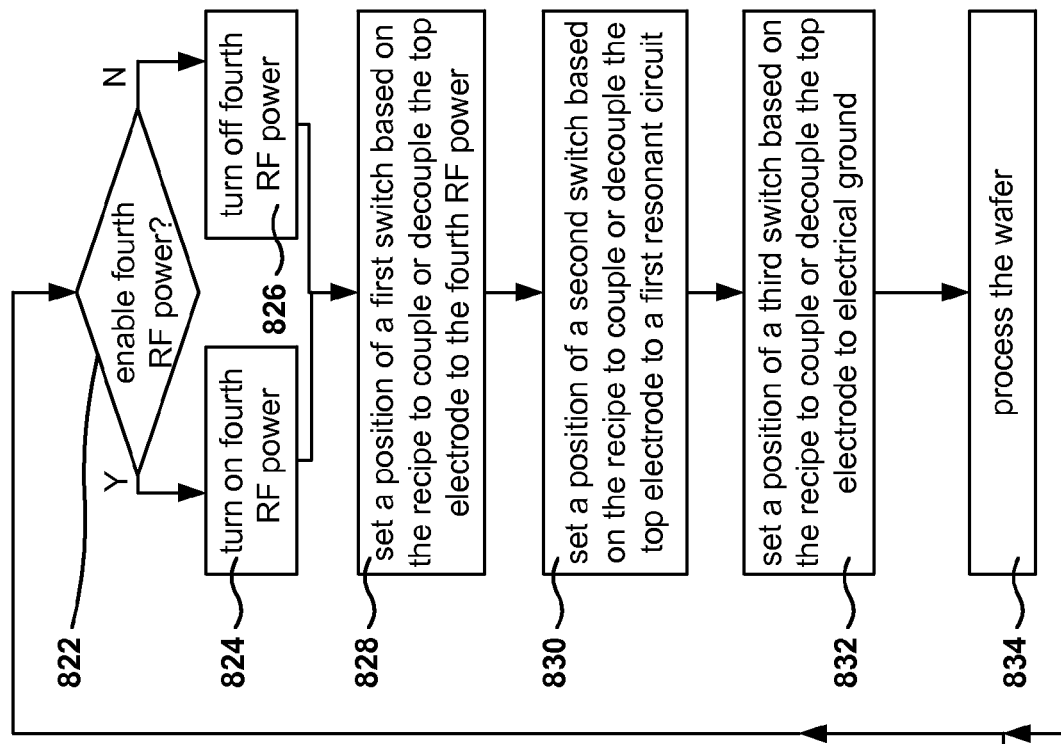
FIGS. 8A-8B show the flows of algorithms for processing a wafer in a wafer processing apparatus including a top electrode and a bottom electrode of a processing chamber, in accordance with one embodiment.
Figure 8A:
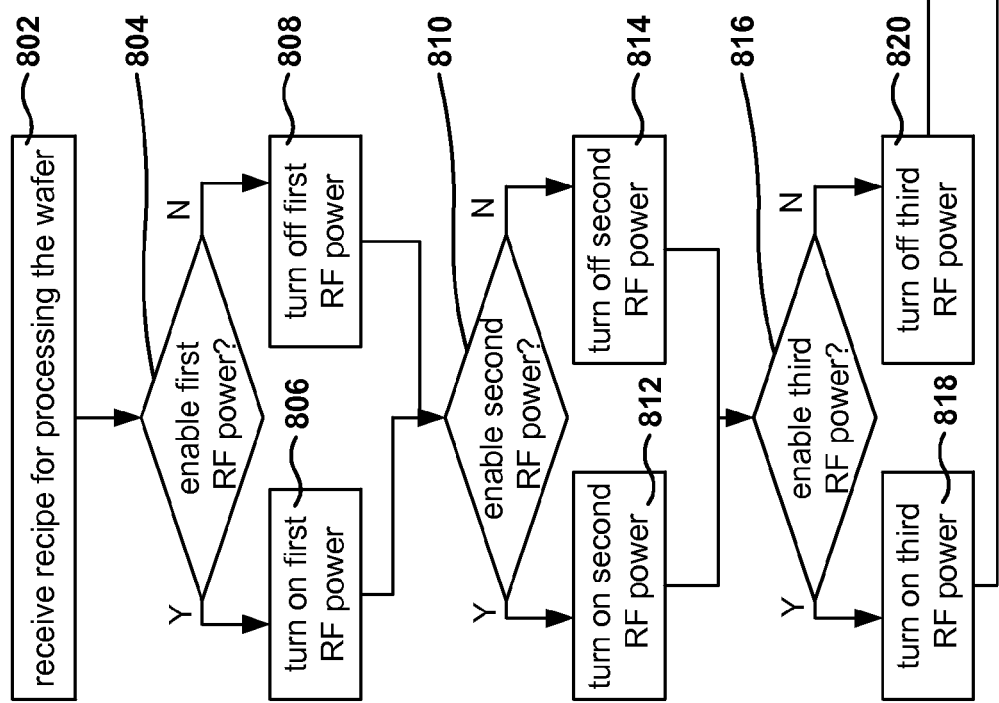

FIG. 8A shows the flow of an algorithm for processing a wafer in a wafer processing apparatus including a top electrode and a bottom electrode of a processing chamber (e.g. the chamber of FIG. 7), in accordance with one embodiment. In operation 802, a recipe for processing the wafer is received. From operation 802, the method flows to operation 804 where a check is made to determine if the first RF power is to be enabled. If the first RF power is to be enabled, the method flows to operation 806, where the first RF power is turned on, and if the first RF power is not to be enabled, the method flows to operation 808, where the RF power is turned off.

In operation 810 a check is made to determine if the second RF power is to be enabled. If the second RF power is to be enabled, the method flows to operation 812, where the second RF power is turned on, and if the second RF power is not to be enabled, the method flows to operation 814, where the second RF power is turned off.

In operation 816 a check is made to determine if the third RF power is to be enabled. If the third RF power is to be enabled, the method flows to operation 818, where the third RF power is turned on, and if the third RF power is not to be enabled, the method flows to operation 820, where the third RF power is turned off.

In operation 822 a check is made to determine if the fourth RF power is to be enabled. If the fourth RF power is to be enabled, the method flows to operation 824, where the fourth RF power is turned on, and if the fourth RF power is not to be enabled, the method flows to operation 826, where the fourth RF power is turned off.

After the four RF powers have been turned on or off, the method flows to operation 828, where a position of the first switch is set, based on the recipe, to couple or decouple the top electrode to the fourth RF power. From operation 828, the method flows to operation 830, where the position of the second switch is set, based on the recipe, to couple or decouple the top electrode to the first resonant circuit.

From operation 830, the method continues to operation 832, where the position of the first switch is set, based on the recipe, to couple or decouple the top electrode to electrical ground. In operation 834 the wafer is processed.

Figure 8B:
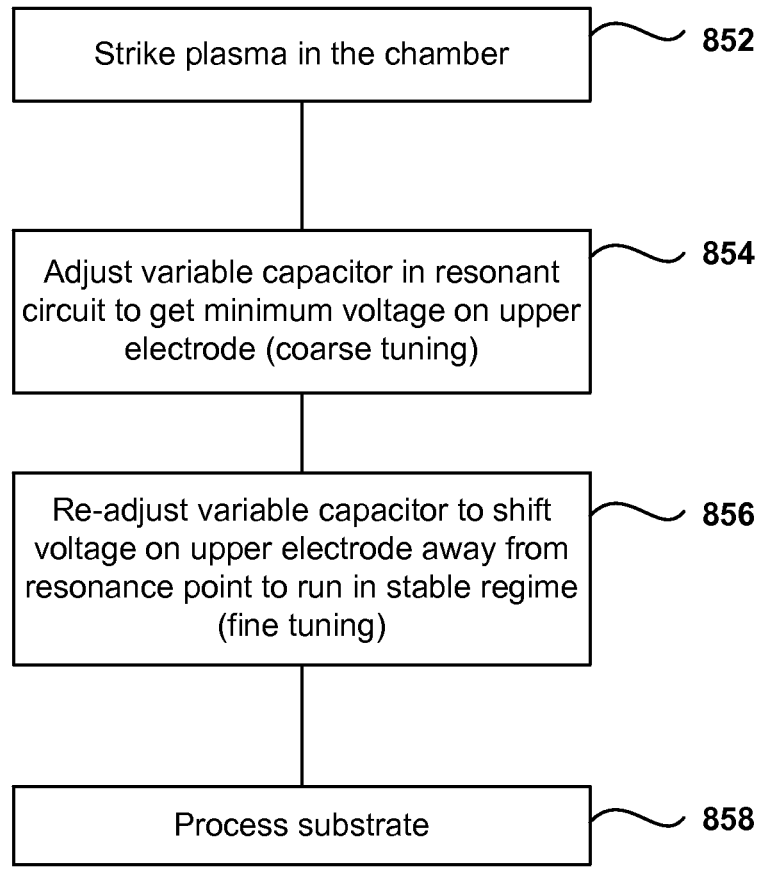

FIG. 8B illustrates a method for tuning a resonant circuit, according to one embodiment (see for example resonant circuit with variable capacitor $C_x$ in FIG. 3A). In operation 852, the plasma is struck in the processing chamber. After the plasma has been struck, in operation 854, the variable capacitor in the resonant circuit is adjusted until the minimum voltage on the upper electrode is obtained. This first adjustment of the variable capacitor is referred to as coarse tuning.

From operation 854, the method flows to operation 856, where the variable capacitor is readjusted to shift the voltage on the upper electrode away from the resonance point in order to run in a stable regime. Because the resonant circuit is near the resonant point, the impedance for the resonant RF frequency will be still very high, but the circuit will be more stable because any small variation in the impedance will not cause a large change in the voltage of the upper electrode. The second adjustment of the variable capacitor is referred to as fine tuning.

After the value for the variable capacitor is set during the operations of coarse tuning and fine tuning, the substrate is processed in the chamber with the fine-tuned resonant circuit.

Figure 9:
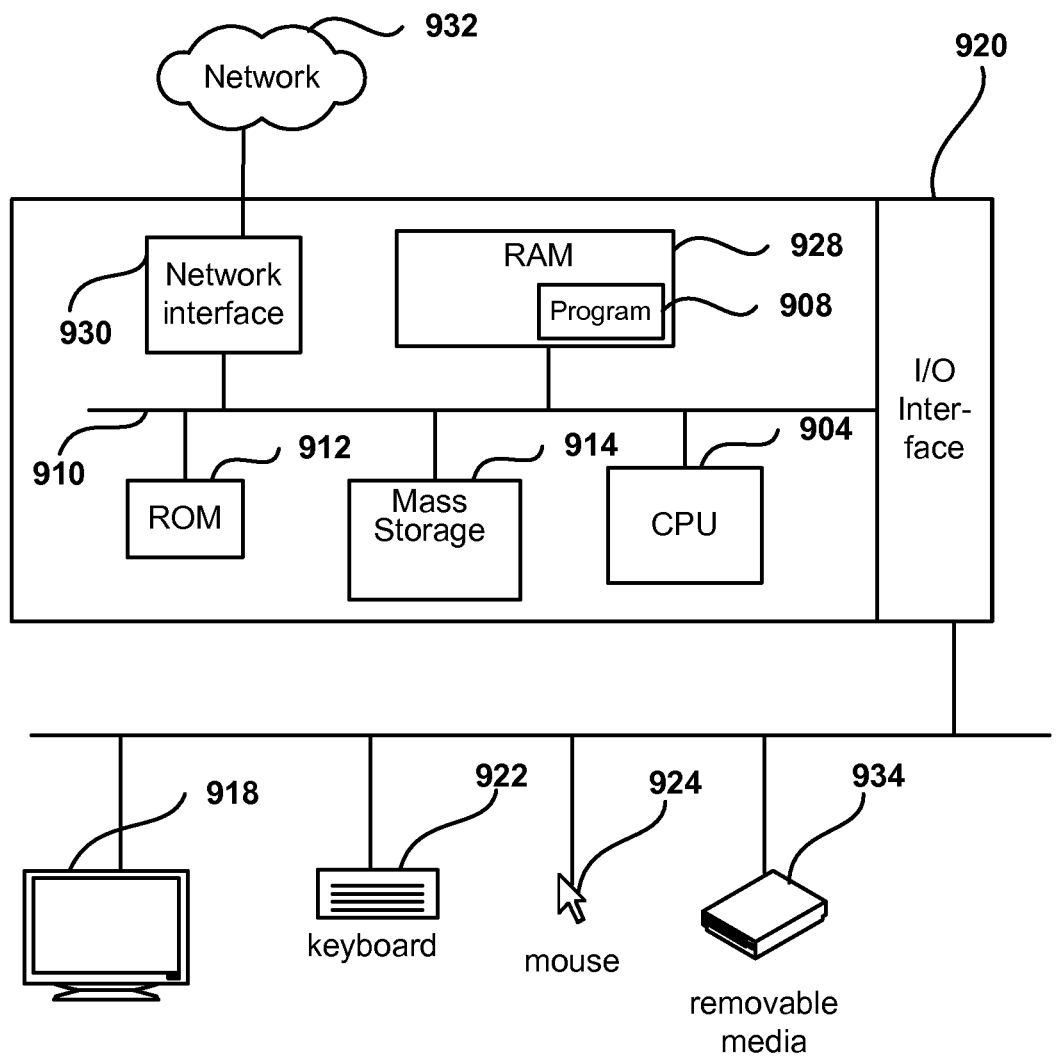
FIG. 9 is a simplified schematic diagram of a computer system for implementing embodiments described herein.

FIG. 9 is a simplified schematic diagram of a computer system for implementing embodiments described herein. It should be appreciated that the methods described herein may be performed with a digital processing system, such as a conventional, general-purpose computer system. Special purpose computers, which are designed or programmed to perform only one function, may be used in the alternative.

The computer system includes a Central Processing Unit (CPU) 904, which is coupled through bus 910 to random access memory (RAM) 928, read-only memory (ROM) 912, and mass storage device 914. Power and impedance control program 908 resides in random access memory (RAM) 928, but can also reside in mass storage 914 or ROM 912.

Mass storage device 914 represents a persistent data storage device such as a floppy disc drive or a fixed disc drive, which may be local or remote. Network interface 930 provides connections via network 932, allowing communications with other devices. It should be appreciated that CPU 904 may be embodied in a general-purpose processor, a special purpose processor, or a specially programmed logic device. Input/Output (I/O) interface provides communication with different peripherals and is connected with CPU 904, RAM 928, ROM 912, and mass storage device 914, through bus 910. Sample peripherals include display 918, keyboard 922, cursor control 924, removable media device 934, etc.

Display 918 is configured to display the user interfaces described herein. Keyboard 922, cursor control 924, removable media device 934, and other peripherals are coupled to I/O interface 920 in order to communicate information in command selections to CPU 904. It should be appreciated that data to and from external devices may be communicated through I/O interface 920. The embodiments can also be practiced in distributed computing environments where tasks are performed by remote processing devices that are linked through a wire-based or wireless network.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A wafer processing apparatus including a top electrode and a bottom electrode of a processing chamber, the wafer processing apparatus comprising:
    a first radio frequency (RF) power source, a second RF power source, and a third RF power source, the first, second, and third RF power sources being coupled to the bottom electrode;
    a fourth RF power source coupled to the top electrode, wherein a stray capacitance is defined between ground and the top electrode;
    a first resonant circuit directly coupled to the top electrode and directly coupled to electrical ground, wherein the first resonant circuit comprises a single physical capacitive element and includes an inductor coupled to the top electrode and a variable capacitor as the physical capacitive element, the variable capacitor being connected directly to electrical ground and connected directly to the inductor is series, the variable capacitor being a tuning element operable to vary a frequency-dependent impedance of the first resonant circuit, wherein the frequency-dependent impedance of the first resonant circuit is defined to present a maximum value at a frequency of the first RF power source, wherein the variable capacitor is tuned to set the frequency-dependent impedance of the first resonant circuit based on the impedance of the stray capacitance coupled in parallel solely with the variable capacitor and the inductor in combination;
    a second resonant circuit coupled between the top electrode and electrical ground, wherein a frequency-dependent impedance of the second resonant circuit is defined to a present a maximum value at a frequency of the second RF power source;
    a third resonant circuit coupled between the top electrode and electrical ground, wherein a frequency-dependent impedance of the third resonant circuit is defined to present a maximum value at a frequency of the third RF power source, wherein the first, second and third RF resonant circuits are coupled in parallel; and
    a filter coupled between the top electrode and the fourth RF power source, wherein a first end of the filter is coupled to the top electrode and to the first resonant circuit, to the second resonant circuit, and to the third resonant circuit, wherein a second end of the filter is coupled to the fourth RF power source, wherein the filter blocks power from the bottom electrode from reaching the fourth RF power source.

2. The apparatus as recited in claim 1 further including:
a system controller, wherein the system controller is operable to set each of the first, second, third, and fourth RF powers to be one of turned on or turned off independently during a wafer processing operation, and wherein the system controller is operable to couple or uncouple the first resonant circuit to the top electrode.

3. The apparatus as recited in claim 2, wherein the system controller is further operable to couple or uncouple the top electrode to electrical ground.

4. The apparatus as recited in claim 1, wherein the wafer processing apparatus is configured according to a configuration including:
the first RF power source settable to a frequency of 60 MHz;
the second RF power source settable to a frequency of 27 MHz;
the third RF power source settable to a frequency of 2 MHz; and
the fourth RF power source settable to a frequency of 400 KHz.

5. The apparatus as recited in claim 1, wherein the frequency-dependent impedance is calculated as $$\frac{j\frac{1}{wC_s}\left(Lw-\frac{1}{wC_x}\right)}{\frac{1}{wC_s}-\left(Lw-\frac{1}{wC_x}\right)},$$

wherein L is an inductance of the inductor, $C_s$ is the stray capacitance, and $C_x$ is a capacitance of the variable capacitor.

6. The apparatus as recited in claim 5, further including:
a system controller defined to set a value of a capacitance of the variable capacitor to make the frequency-dependent impedance have the maximum value at the frequency of the first RF power source.

7. The apparatus as recited in claim 1,
wherein the second resonant circuit comprises a single physical second capacitive element and includes a second inductor coupled to the top electrode and a second variable capacitor as the physical capacitive element, the second variable capacitor being connected directly to electrical ground and connected directly to the second inductor in series, the second variable capacitor being a tuning element operable to vary the frequency-dependent impedance of the second resonant circuit;
wherein the third resonant circuit comprises a single physical third capacitive element and includes a third inductor coupled to the top electrode and a third variable capacitor as the physical capacitive element, the third variable capacitor being connected directly to electrical ground and connected directly to the third inductor in series, the third variable capacitor being a tuning element operable to vary the frequency-dependent impedance of the third resonant circuit, and
wherein the first end of the filter is directly connected simultaneously to the top electrode, to the inductor of the first resonant circuit at an end of the inductor opposite the variable capacitor, to the second inductor of the second resonant circuit at an end of the second inductor opposite the second variable capacitor, and to the third inductor of the third resonant circuit at an end of the third inductor opposite the third variable capacitor.

8. A wafer processing apparatus including a top electrode and a bottom electrode of a processing chamber, the wafer processing apparatus comprising:
a first radio frequency (RF) power source, a second RF power source, a third RF power source, and a fourth RF power source, the first, second, and third RF power sources being coupled to the bottom electrode, wherein a stray capacitance is defined between ground and the top electrode;
a first resonant circuit directly coupled to the top electrode and directly coupled to electrical ground, wherein the first resonant circuit comprises a single physical capacitive element and includes an inductor coupled to the top electrode and a variable capacitor as the capacitive element, the variable capacitor being connected directly to electrical ground and connected directly to the inductor in series, the variable capacitor being a tuning element operable to vary a frequency-dependent impedance of the first resonant circuit, wherein the frequency-dependent impedance of the first resonant circuit is defined to present a maximum value at a frequency of the first RF power source, wherein the variable capacitor is tuned to set the frequency-dependent impedance of the first resonant circuit based on the impedance of the stray capacitance coupled in parallel solely with the variable capacitor and the inductor in combination;
a second resonant circuit coupled between the top electrode and electrical ground, wherein a frequency-dependent impedance of the second resonant circuit is defined to present a maximum value at a frequency of the second RF power source;
a third resonant circuit coupled between the top electrode and electrical ground, wherein a frequency-dependent impedance of the third resonant circuit is defined to present a maximum value at a frequency of the third RF power source, wherein the first, second and third RF resonant circuits are coupled in parallel;
a filter coupled between the top electrode and the fourth RF power source, wherein a first end of the filter is coupled to the top electrode and to the first resonant circuit, to the second resonant circuit, and to the third resonant circuit, wherein a second end of the filter is coupled to the fourth RF power source, wherein the filter blocks power from the bottom electrode from reaching the fourth RF power source; and
a first switch, a second switch, and a third switch, the first switch being operable to couple the top electrode to the fourth RF power source, the second switch being operable to couple the top electrode to the first resonant circuit or the second resonant circuit or the third resonant circuit, and the third switch being operable to couple the top electrode to a first voltage.

9. The apparatus as recited in claim 8, wherein a frequency of the first RF power is 60 MHz, wherein a frequency of the second RF power is 27 MHz, wherein a frequency of the third RF power is 2 MHz, and wherein a frequency of the fourth RF power is 400 KHz.

10. The apparatus as recited in claim 8, further including:
a first power controller operable to activate the first RF power source based on a recipe for processing the wafer.

11. The apparatus as recited in claim 8, further including:
a system controller operable to set power levels for the first, second, third, and fourth RF power sources.

12. The apparatus as recited in claim 8, wherein a frequency of the fourth RF power is in a range from 0.1 to 10 MHz.

13. The apparatus as recited in claim 8, further including:
a system controller defined to set a value of a capacitance of the variable capacitor to make the frequency-dependent impedance have the maximum value at the frequency of the first RF power source, wherein the frequency-dependent impedance is calculated as $$\frac{j\frac{1}{wC_s}\left(Lw-\frac{1}{wC_x}\right)}{\frac{1}{wC_s}-\left(Lw-\frac{1}{wC_x}\right)},$$

wherein L is an inductance of the inductor, $C_s$ is the stray capacitance, and $C_x$ is a capacitance of the variable capacitor.

14. A wafer processing apparatus including a top electrode and a bottom electrode of a processing chamber, the wafer processing apparatus comprising:
a first radio frequency (RF) power source, a second RF power source, a third RF power source, and a fourth RF power source, the first, second, and third RF power sources being coupled to the bottom electrode, wherein a stray capacitance is defined between ground and the top electrode;
a first resonant circuit directly coupled to the top electrode and directly coupled to electrical ground, wherein the first resonant circuit comprises a single physical capacitive element and includes an inductor coupled to the top electrode and a variable capacitor as the physical capacitive element, the variable capacitor being connected directly to electrical ground and connected directly to the inductor in series, the variable capacitor being a tuning element operable to vary a frequency-dependent impedance of the first resonant circuit, wherein the frequency-dependent impedance of the first resonant circuit is defined to present a maximum value at a frequency of the first RF power source, wherein the variable capacitor is tuned to set the frequency-dependent impedance of the first resonant circuit based on the impedance of the stray capacitance coupled in parallel solely with the variable capacitor and the inductor in combination;
a second resonant circuit coupled between the top electrode and electrical ground, wherein a frequency-dependent impedance of the second resonant circuit is defined to present a maximum value at a frequency of the second RF power source;
a third resonant circuit coupled between the top electrode and electrical ground, wherein a frequency-dependent impedance of the third resonant circuit is defined to present a maximum value at a frequency of the third RF power source, wherein the first, second and third RF resonant circuits are coupled in parallel;
a filter coupled between the top electrode and the fourth RF power source, wherein a first end of the filter is coupled to the top electrode and to the first resonant circuit, to the second resonant circuit, and to the third resonant circuit, wherein a second end of the filter is coupled to the fourth RF power source, wherein the filter blocks power from the bottom electrode from reaching the fourth RF power source; and
a first switch, a second switch, a third switch, a fourth switch, and a fifth switch, the first switch being operable to couple the top electrode to the fourth RF power source, the second switch being operable to couple the top electrode to the first resonant circuit, the third switch being operable to couple the top electrode to a first voltage, the fourth switch being operable to couple the top electrode to the second resonant circuit, and the fifth switch being operable to couple the top electrode to the third resonant circuit.

15. The apparatus as recited in claim 14, further including:
a system controller defined to set a value of a capacitance of the variable capacitor to make the frequency-dependent impedance have the maximum value at the frequency of the first RF power source, wherein the frequency-dependent impedance is calculated as $$\frac{j\frac{1}{wC_s}\left(Lw-\frac{1}{wC_x}\right)}{\frac{1}{wC_s}-\left(Lw-\frac{1}{wC_x}\right)},$$

wherein L is an inductance of the inductor, $C_s$ is the stray capacitance, and $C_x$ is a capacitance of the variable capacitor.

* * * * *